United States Patent
Tao et al.

(10) Patent No.: US 7,092,096 B2
(45) Date of Patent: Aug. 15, 2006

(54) OPTICAL SCATTEROMETRY METHOD OF SIDEWALL SPACER ANALYSIS

(75) Inventors: Hun-Jan Tao, Hsinchu (TW); Fang-Chang Chen, Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 342 days.

(21) Appl. No.: 10/783,583

(22) Filed: Feb. 20, 2004

(65) Prior Publication Data

US 2005/0185197 A1   Aug. 25, 2005

(51) Int. Cl.
*G01J 4/00* (2006.01)
*G01V 8/00* (2006.01)
*G06F 16/00* (2006.01)

(52) U.S. Cl. .................. 356/369; 356/394; 250/559.24; 250/559.42; 702/155; 702/167

(58) Field of Classification Search ................ 356/369, 356/364, 394
See application file for complete search history.

(56) References Cited

U.S. PATENT DOCUMENTS

| | | | | |
|---|---|---|---|---|
| 6,639,663 B1 * | 10/2003 | Markle et al. | ........... | 356/237.4 |
| 6,643,008 B1 * | 11/2003 | Stirton et al. | ............ | 356/237.5 |
| 6,782,337 B1 * | 8/2004 | Wack et al. | ................ | 702/155 |

\* cited by examiner

*Primary Examiner*—Gregory J. Toatley, Jr.
*Assistant Examiner*—Roy M. Punnoose
(74) *Attorney, Agent, or Firm*—Tung & Associates

(57) ABSTRACT

A method of analyzing structural characteristics of sidewall spacers fabricated on a wafer is disclosed. A grating bar having a plurality of grating targets is provided. A theoretical optical scatterometry spectrum is generated by subjecting the grating targets to optical scatterometry. An experimental optical scatterometry spectrum is generated by subjecting the sidewall spacers on the wafer to optical scatterometry. The structural characteristics of the sidewall spacers are equated with the structural characteristics of the grating targets when the theoretical optical scatterometry spectrum substantially matches the experimental optical scatterometry spectrum.

22 Claims, 3 Drawing Sheets

US 7,092,096 B2

OPTICAL SCATTEROMETRY METHOD OF SIDEWALL SPACER ANALYSIS

FIELD OF THE INVENTION

The present invention relates to processes for analyzing the width, top loss and other parameters of sidewall spacers in the semiconductor fabrication industry. More particularly, the present invention relates to method which uses optical scatterometry to accurately and simultaneously measure both the width and top loss of sidewall spacers after an etching process.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Additional techniques, such as dual damascene processes, are used to form conductive vias which establish electrical contact between vertically-spaced conductive lines or layers in the circuits. The finished semiconductor product includes microelectronic devices including transistors, capacitors and resistors that form the integrated circuits on each of multiple die on a single wafer.

Transistors are important electrical elements in integrated circuits. Various design features, such as gate length and channel length, of transistors are being steadily increased to achieve higher package densities in the enhancement of device performance. In complex digital circuits such as microprocessors, fast-switching transistors are increasingly in demand. Thus, the channel or gate length, which is the distance between the drain region and the source region of a field effect transistor (FET), is being steadily reduced to reduce the electrical resistance of the transistor.

A cross-section of a typical transistor structure 10 is shown in FIG. 1. The transistor structure 10 is fabricated between spaced-apart shallow trench isolation (STI) regions 24 (one of which is shown in FIG. 1), typically silicon dioxide, which are initially formed in a silicon wafer substrate 12. An insulating layer 26, such as silicon dioxide, covers the surface of the substrate 12. The transistor structure 10 includes an electrically-insulating gate oxide layer 14, which is typically a thermally-grown silicon dioxide and is formed over the substrate 12, between the STI regions 24. A gate electrode 16, which is typically polysilicon, is formed on the gate oxide layer 14. A TEOS or other oxide layer 18 and a nitride layer 20 are sequentially formed on respective sides of the gate electrode 16.

After anisotropic etching of the nitride layer 20, the oxide layer 18 and the nitride layer 20 together form an electrically-insulating sidewall spacer, also known as a mini-spacer 22. Relative to the gate electrode 16, the upper surfaces of the oxide layer 18 and nitride layer 20 are characterized by a top loss 28, which corresponds to material lost during etching. The traditional sidewall spacer 22, shown in FIG. 1, extends in generally perpendicular relationship to the plane of the substrate 12. In some applications, the sidewall spacer 22 is tilted with respect to the plane of the substrate 12 and is known as an offset spacer.

Ion implantation is used to form active regions on the transistor structure 10. The ion implantation process includes the implantation of dopant ions in the substrate 12 to form a source/drain implant in the source and drain regions. Because the sidewall spacers 22 define the boundaries of the source/drain implant regions in the substrate 12, the width and top loss 28 of the sidewall spacers 22 after etching are important to achieve proper ion implantation in the substrate 12.

As microelectronic fabrication integration levels have increased and patterned microelectronic conductor layer dimensions have decreased, it has become increasingly important within the art of microelectronic fabrication to form within microelectronic fabrications patterned microelectronic conductor layers, such as but not limited to gate electrodes within field effect transistors (FETs), as well as patterned microelectronic conductor interconnect layers, with a uniform sidewall profile. Uniform sidewall profiles are particularly desirable within gate electrodes in field effect transistors since gate electrode linewidth and profile define operational parameters of the integrated circuit within which is formed the FET. Furthermore, the width of sidewall spacers has decreased with the increased miniaturization of device features.

Throughout the course of semiconductor fabrication, it is frequently necessary to measure various parameters of the sidewall spacers in a transistor structure, such as, for example, the spacer width and top loss after etching. Conventional methods for measuring the width of the sidewall spacers includes in-line CD SEM (scanning electron micrograph), in the case of traditional spacers, and TEM (transmission electron microscopy), in the case of offset spacers. Conventional methods for measuring the spacer top loss include off-line SEM (for traditional spacers) and TEM (for thin offset spacers).

The conventional SEM and TEM methods for measuring the spacer width and spacer top loss have several drawbacks. Due to image contrast issues and line edge roughness issues, it is often difficult to obtain reliable results using in-line SEM. Furthermore, on offset spacers, the sidewalls are often too thin for accurate spacer width measurement using SEM, so TEM must be used. TEM, however, is a time-consuming process and cannot be used in routine in-line measurement. Accordingly, a new and improved method is needed to measure the spacer width and top loss of sidewall spacers in semiconductor fabrication.

An object of the present invention is to provide a novel method for measuring spacer profiles in semiconductor fabrication.

Another object of the present invention is to provide a novel method which uses optical scatterometry to measure various aspects of sidewall spacers in semiconductor fabrication.

Yet another object of the present invention is to provide an optical scatterometry method of sidewall spacer analysis which includes providing a grating bar having multiple grating targets that simulate the CD (critical dimension), height, spacer width, top loss and other physical characteristics or the physical geometry of a spacer on a semiconductor wafer; generating theoretical optical scatterometry spectra of the grating targets on the grating bar; generating an experimental optical scatterometry spectrum of spacers fabricated on a production wafer; and comparing the theoretical optical scatterometry spectra obtained from the grating targets with the experimental optical scatterometry spectrum obtained from the spacers to determine a match which indicates the spacer width, top loss or other structural characteristics or the structural geometry of the spacers.

Still another object of the present invention is to provide an optical scatterometry method of spacer analysis which is efficient, can be used in-line and does not require destruction of a sample to determine various structural characteristics of spacers.

SUMMARY OF THE INVENTION

In accordance with these and other object and advantages, the present invention is generally directed to a novel method which is particularly suitable for measuring the spacer width and top loss characteristics of spacers fabricated on semiconductor wafers. The method includes fabricating a grating bar which typically includes multiple grating targets on a wafer. The grating targets on the wafer approximate or simulate the structural characteristics including the width, height, CD (critical dimension), top loss and line/space ratio of actual sidewall spacers fabricated on a semiconductor wafer. The grating bar is subjected to optical scatterometry using a spectroscopic ellipsometer system, and the structural parameters of the grating targets are varied by computer simulation to obtain theoretical optical scatterometry spectra which correspond to the structural characteristics of the grating targets. The theoretical spectra are stored in a spectrum library. During semiconductor fabrication, spacers on a production wafer are subjected to optical scatterometry to obtain an experimental optical scatterometry spectrum of the spacers. The experimental spectrum of the spacers is compared to the theoretical spectra obtained from the spectrum library. Accordingly, the theoretical spectrum obtained for the grating targets which most closely matches the experimental spectrum obtained for the spacers corresponds to the grating target structural characteristics which are substantially the same as the spacer width or top loss dimensions of the spacer structures.

BRIEF DESCRIPTION OF THE DRAWINGS

The invention will now be described, by way of example, with reference to the accompanying drawings, in which.

DETAILED DESCRIPTION OF THE INVENTION

Figure 1:
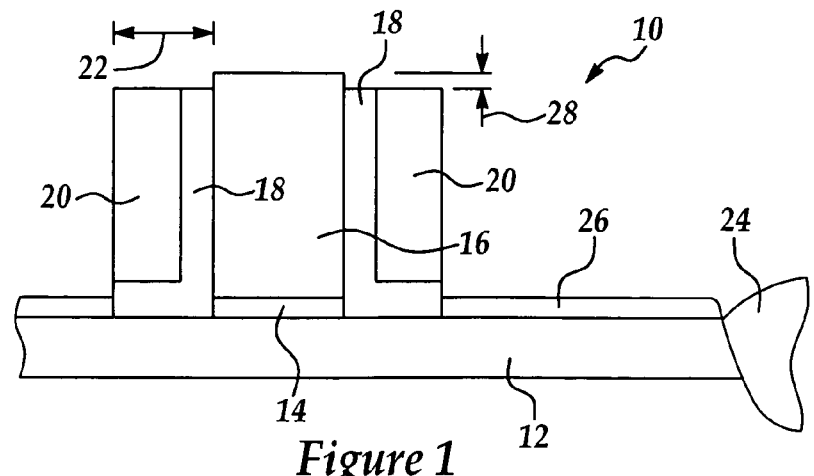
FIG. 1 is a cross-section of a typical conventional transistor structure having sidewall spacers.

The present invention contemplates a novel method which can be used to measure the spacer width, top loss and other structural characteristics of spacers fabricated on semiconductor wafers, particularly after an etching process. The method includes fabricating a grating bar having multiple grating targets. The grating targets are typically fabricated on a silicon wafer and approximate or simulate the structural characteristics including the spacer width, top loss, height, CD (critical dimension), SWA, film stack and line/space ratio characteristics of actual sidewall spacers fabricated on a production wafer.

According to one embodiment of the method of the present invention, the grating bar is subjected to optical scatterometry, using a spectroscopic ellipsometer system, to obtain an optical scatterometry spectrum which reflects the structural characteristics and film scheme of the grating targets. A computer is used to create a set of theoretical spectra which correspond to various pre-set structural characteristics and film stack parameters of the grating targets. The created set of theoretical spectra is used to create a spectrum library. An experimental spectrum is then obtained by subjecting the spacers on the production wafer to optical scatterometry. A match is then made between the experimental spectrum and the most closely-matching theoretical spectrum selected from the spectrum library. The matching theoretical spectrum is then linked with the corresponding pre-set structural characteristics and film stack parameters to obtain the structural characteristics and film stack parameters of the spacers on the production wafer.

In another embodiment, the method is carried out according to a "real time" mode in which the structural characteristic and film scheme parameters of the grating targets are varied by computer simulation to obtain theoretical optical scatterometry spectra which correspond to the simulated structural characteristics of the grating targets. If a theoretical spectrum matches the experimental spectrum, then the simulated structural characteristics and film scheme which produced the theoretical spectrum indicate the structural characteristics and film scheme parameters of the spacers on the production wafer. This method may utilize a computer which can be clustered into an etcher or photo track to simultaneously measure the experimental spectrum and theoretical spectra and perform a match in real-time, without the need to store the theoretical spectra in a spectrum library.

In the first embodiment, during the course of semiconductor fabrication, spacers on a production wafer are subjected to optical scatterometry to obtain an experimental optical scatterometry spectrum of the spacers. The experimental optical scatterometry spectrum reflects the structural characteristics of the spacers in the same manner as the theoretical optical scatterometry spectra reflect the structural characteristics of the grating targets on the grating bar. The experimental optical scatterometry spectrum is compared to the computer-simulated theoretical optical scatterometry spectra obtained from the spectrum library. Accordingly, the theoretical spectrum which most closely matches the experimental spectrum obtained for the spacers corresponds to the grating target dimensions and physical characteristics which are substantially the same as those of the spacer structures. The critical dimension, height, spacer width, top loss and other structural characteristics of the grating targets therefore correspond to those respective characteristics of the spacers when the theoretical spectrum of the grating targets matches or most closely matches the experimental spectrum of the spacers.

Figure 4:
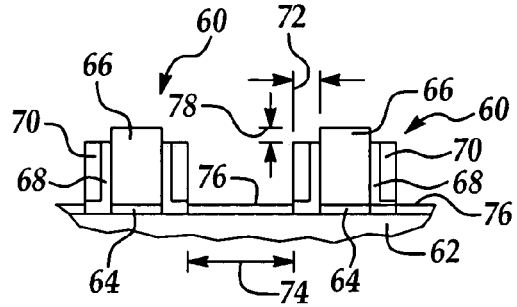
FIG. 4 is a cross-section of a pair of transistor structures fabricated on a production wafer, each transistor structure having a pair of sidewall spacers to be analyzed according to the method of the present invention.

Referring initially to FIG. 4, a pair of transistor structures 60 fabricated on a production wafer substrate 62 is shown at one stage of integrated circuit fabrication. An insulating layer 76, such as silicon dioxide, typically covers the surface of the wafer 62. Each transistor structure 60 includes a gate oxide layer 64, which is typically a thermally-grown silicon dioxide formed on the wafer 62. A gate electrode 66, typically polysilicon, is formed on the gate oxide layer 64. A sidewall spacer 72 provided on each side of the gate electrode 66 includes an inner oxide layer 68 and an outer nitride layer 70.

In fabrication of the transistor structures 60, the oxide layer 68 and the nitride layer 70 are etched to form the electrically-insulating sidewall spacer 72, as is known by those skilled in the art. The upper surfaces of the oxide layer 68 and nitride layer 70 are characterized by a top loss 78, which corresponds to material lost during etching. According to the method of the present invention, the width of the sidewall spacer 72 and the top loss 78, as well as other structural parameters of the transistor structures 60, are measured after etching using optical scatterometry, as hereinafter described, prior to resuming fabrication of integrated circuits on the substrate 62. The method of the present invention provides a precise in-line metrology technique to measure the width of sidewall spacers 72 having a magnitude of as little as 50 angstroms or smaller.

Figure 2:
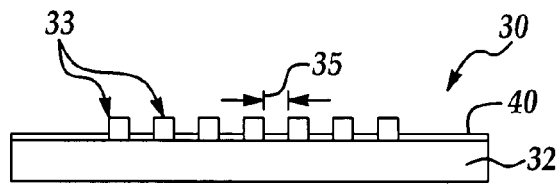
FIG. 2 is a side view of a grating bar used in implementation of the method of the present invention.
Figure 3:
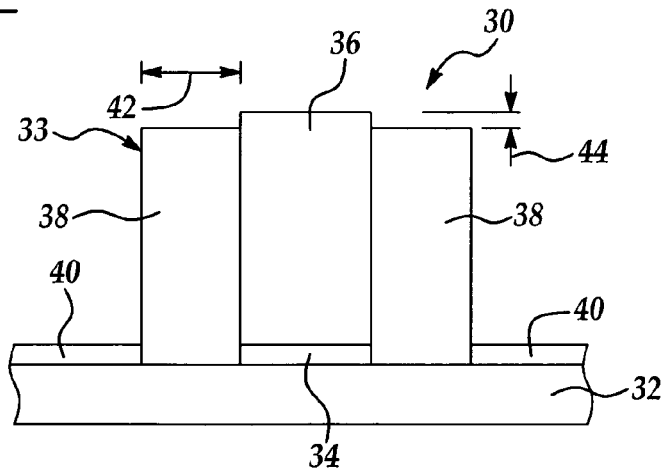
FIG. 3 is a cross-section of one of multiple grating targets provided on the grating bar of FIG. 2.

Referring next to FIGS. 2 and 3, a grating bar 30 used in implementation of the method of the present invention includes a bar substrate 32, which may be a silicon semiconductor wafer, for example. Multiple grating targets 33 are provided on the bar substrate 32, in spaced-apart relationship to each other. The structural characteristics of the grating targets 33, as well as the spacing 35 between adjacent grating targets 33, simulate and approximate the structural characteristics and spacings 74, respectively, of the transistor structures 60 fabricated on the production wafer 62 heretofore described with respect to FIG. 4. An insulating layer 40, which may be silicon dioxide, for example, typically covers the surface of the bar substrate 32. The grating targets 33 preferably cover a rectangular-shaped area of at least about 20 μm×20 μm on the surface of the bar substrate 32.

As shown in FIG. 3, each grating target 33 on the bar substrate 32 typically includes a gate oxide layer 34 which may be silicon dioxide, for example, and is deposited on the bar substrate 32; a gate electrode 36, typically polysilicon, formed on the gate oxide layer 34; and a simulated sidewall spacer 42, characterized by a dielectric layer 38, provided on each side of the gate electrode 36. The gate oxide layer 34 and gate electrode 36 of each grating target 33 may be formed using conventional deposition techniques known by those skilled in the art. The simulated sidewall spacers 42 are formed and then etched to define a simulated top loss 44, typically using the same deposition and etching techniques which are used to fabricate the transistor structures 60 on the production wafer substrate 64 of FIG. 4.

Each simulated sidewall spacer 42 may be a single dielectric layer 38, or alternatively, may be multiple dielectric layers. The dielectric layer 38 may be an oxide, a nitride, an oxynitride or any combination of and oxide, a nitride and an oxynitride. The simulated sidewall spacer 42 can be a single layer thin offset spacer, an L-shaped spacer, a triangular-shaped spacer or a trapezoid-shaped spacer. The total thickness of the simulated sidewall spacer 42 is typically up to about 1,000 angstroms.

The single dielectric layer 38 of each sidewall spacer 42 is characterized by reduced horizontal complexity as compared to that of the sidewall spacers 72 of the transistor structures 60 fabricated on the production wafer of FIG. 4. This reduced horizontal complexity renders the simulated sidewall spacers 42 more amenable to generating optical scatterometry computer simulations in implementation of the method of the present invention, as hereinafter described.

Figure 5:
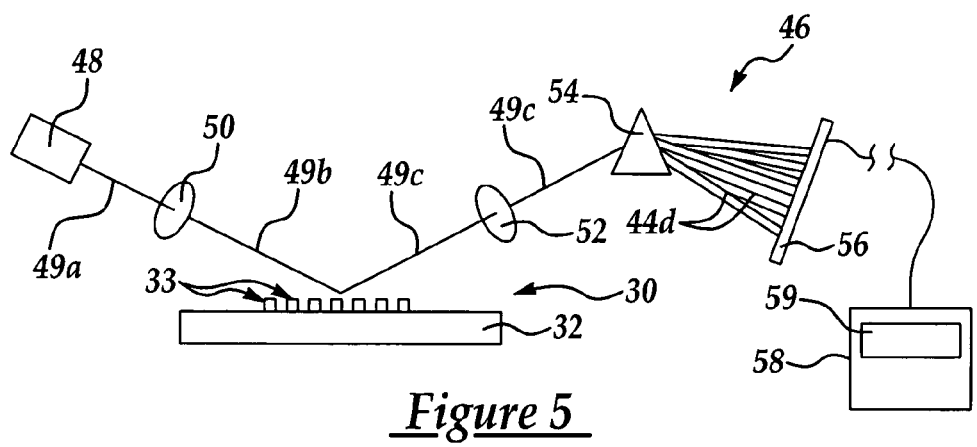
FIG. 5 is a schematic of a conventional spectroscopic ellipsometer system being used to generate an optical scatterometry spectrum of grating targets on a grating bar in implementation of the method of the present invention.

Referring next to FIG. 5, a conventional spectroscopic ellipsometer system 46 in implementation of the present invention is shown. Spectroscopic ellipsometry technique is widely used for thin film metrology in the semiconductor industry. The spectroscopic ellipsometer system 46 includes a broadband light source 48 which emits a beam of incident light 49a through a rotating polarizer 50, which polarizes the incident light 49a. Polarized light 49b emerges from the rotating polarizer 50 and strikes the object of interest, which is, in this case, either the grating targets 33 provided on the grating bar 30, as shown, or the transistor structures 60 (FIG. 4) fabricated on the production wafer substrate 62 during the course of semiconductor fabrication, as will be hereinafter described.

The polarized light 49b is reflected from the object of interest as reflected light 49c, which passes through an analyzer 52 and a prism 54, respectively. The prism 54 separates the reflected light 49c into a light spectrum 49d. The light spectrum 49d strikes an array detector 56. A computer 58, having a monitor screen 59, is connected to the array detector 56. The computer 58 is provided with supporting software which enables the computer 58 to plot the degree of polarization versus the wavelength of the reflected light 49c reflected from the object of interest, based on the light spectrum 49*d* that strikes the array detector 56. In the case in which the grating bar 30 is the object of interest, as shown, the degree of polarization of the reflected light 49*c* at each wavelength is determined by the various structural characteristics of the grating targets 33, such as the spacer width, top loss, critical dimension and thicknesses of the film layers, as well as the refractive indices and extinction coefficients of the film layers and the bar substrate 32.

Figure 9:
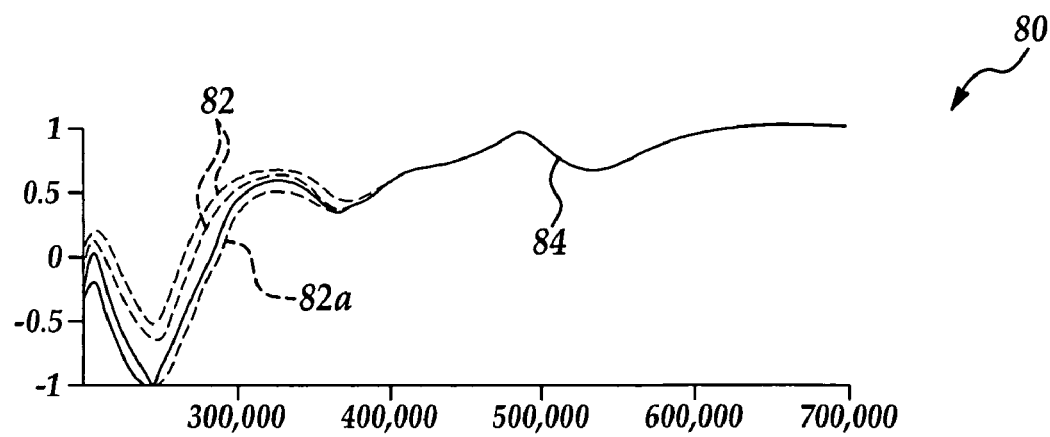
FIG. 9 is a spectrum graph with theoretical optical scatterometry spectra lines (indicated by the dashed lines) superimposed on an experimental optical scatterometry spectrum line (indicated by the solid line), in determining the structural parameters or characteristics of sidewall spacers on production wafers according to the method of the present invention.

Referring next to FIG. 9, based on imput from the array detector 56, the computer 58 generates a spectrum graph 80 in which the degree of polarization of the reflected light 49*c* is represented numerically from −1 to +1 and plotted along the Y-axis. The wavelength of the light, typically from 250 nm to 750 nm, is plotted along the X-axis of the spectrum graph 80. The spectrum graph 80 is displayed on the monitor screen 59 of the computer 58.

The spectrum graph 80 includes multiple theoretical optical scatterometry spectra lines 82, one of which corresponds to the actual structural characteristics of the grating targets 33 on the grating bar 30, as revealed by spectroscopy analysis using the system 46. The computer 58 may be programmed to generate simulated variations on the structural characteristics of the grating targets 33 on the grating bar 30, in which case the theoretical optical scatterometry spectrum lines 82 reflect those simulated structural characteristics of the grating targets 33 as those characteristics would be revealed by spectroscopic analysis using the system 46. An experimental optical scatterometry spectrum line 84, which corresponds to the structural characteristics of the transistor structures 60 fabricated on the production wafer 62 as revealed by spectroscopic analysis, is further plotted on the spectrum graph 80. As hereinafter further described, the theoretical spectrum line 82 which most closely matches the experimental spectrum line 84 corresponds to the grating targets 33 having the actual or computer-generated structural characteristic parameters which most closely approximate the structural characteristic parameters of the transistor structures 60 on the production wafer 62.

The spectrum graph 80 shown in FIG. 9 illustrates just one experimental spectrum, $\alpha(\lambda)$, of the incident light 49*a* obtained from the spectrographic ellipsometer (SE) measurements of the grating targets 33 and the transistor structures 60. Preferably, however, two experimental spectra, $\alpha(\lambda)$ and $\beta(\lambda)$, are obtained from the incident light 49*a* in each SE measurement.

Figure 6:
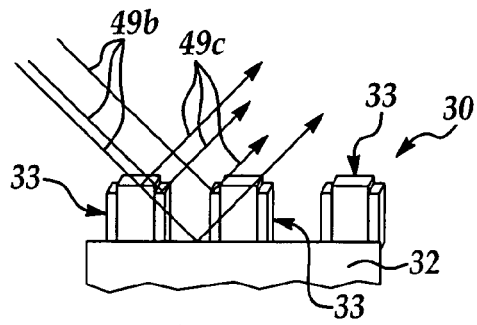
FIG. 6 is an enlarged, sectional view of the grating bar shown in FIG. 5, illustrating reflection of light rays from the grating targets on the grating bar in implementation of the method of the present invention.
Figure 7:
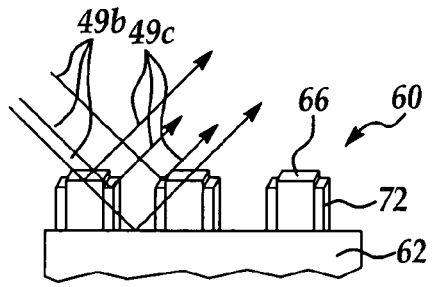
FIG. 7 is a sectional view of the production wafer shown in FIG. 4, illustrating reflection of light rays from the sidewall spacers in implementation of the method of the present invention.
Figure 8:
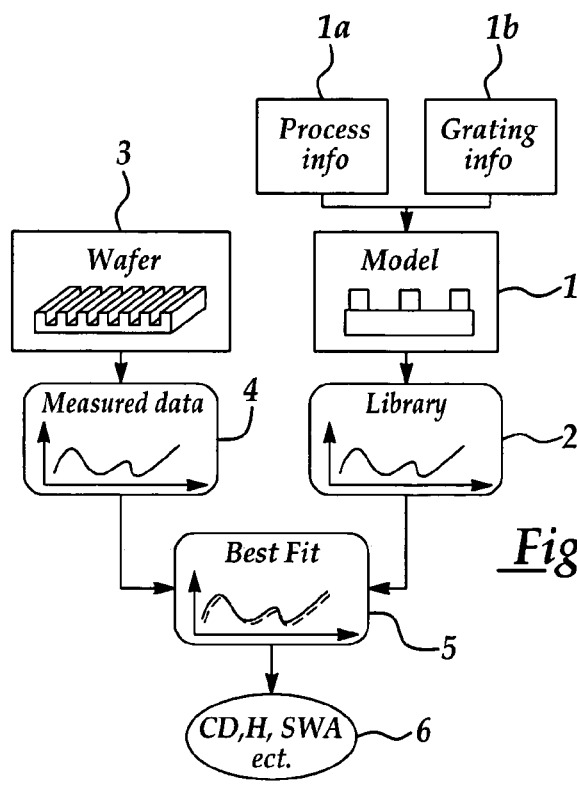
FIG. 8 is a flow diagram which illustrates a preferred embodiment of the method of the present invention.

Referring next to FIGS. 5–9, typical implementation of the method of the present invention is as follows. As shown in FIG. 8, process information and grating information are initially gathered, as indicated in steps 1*a* and 1*b*, respectively, and used to fabricate the grating bar 30, as indicated in step 1. The process information and grating information correspond to process parameter recipes which are used to fabricate transistor structures 60 (FIG. 4) having sidewall spacers 72 on actual production wafers 62 during the fabrication of integrated circuits on the wafers 62. These process parameter recipes are also used to fabricate the grating targets 33 on the grating bar 30 such that the simulated sidewall spacer 42 (FIG. 3), simulated top loss 44, height and spacing 35 (FIG. 2) of the grating targets 33 on the grating bar 30 as closely as possible approximate those respective structural characteristics and dimensions of the transistor structures 60 to be fabricated on the production wafer substrate 62 and tested according to the method of the present invention.

As indicated in step 2 of FIG. 8, the grating bar 30 is next subjected to spectroscopic ellipsometry using the system 46. Accordingly, as shown in FIG. 5, incident light 49*a* is emitted from the broadband light source 48 and passes through the rotating polarizer 50. Polarized light 49*b* emerges from the rotating polarizer 50 and strikes the grating targets 33 on the grating bar 30. As shown in FIG. 6, the polarized light 49*b* is reflected from the grating targets 33, including the simulated sidewall spacers 42 (FIG. 3) thereof, as reflected light 49*c*. The reflected light 49*c* passes through the analyzer 52 and the prism 54, respectively, and the prism separates the reflected light 49*c* into the light spectrum 49*d*. The light spectrum 49*d* impinges on the array detector 56.

Based on data input from the array detector 56, the computer 58 plots the spectrographic information for the actual structural characteristics of the grating targets 33 on a spectrum graph 80, as heretofore described with respect to FIG. 9, and stores the spectrographic information in a database. The computer 58 is then used to generate spectographic information which is based on simulated structural characteristics of the grating targets 33 that vary with respect to the actual structural characteristics previously analyzed using the system 46 and stored as spectrographic information on the computer 58. This simulated spectographic information is plotted with the actual spectographic information on the spectrum graph 80 and stored as a library, as indicated in step 2 of FIG. 8.

After creation of the spectographic information library based on actual and simulated analysis of the grating targets 33 on the grating bar 30, the transistor structures 60 fabricated on the production wafer 62 are analyzed using the system 46, as indicated in step 3 of FIG. 8 and in the same manner as heretofore described with respect to the grating bar 30 in FIG. 5. The spectroscopic analysis typically follows an etching process in which the sidewall spacers 72 (FIG. 4) and top loss 78 are configured in each of the transistor structures 60. The etching process may be conventional and may or may not be followed by wet cleaning of the sidewall spacers 72.

During spectroscopic analysis, as shown in FIG. 7, polarized light 49*c* is reflected from the transistor structures 60, including the sidewall spacers 72. The polarized light 49*c* is separated by the prism 54 into a light spectrum 49*d*, which strikes the array detector 56. Based on data input from the array detector 56, the computer 58 plots the spectrographic information for the structural characteristics of the transistor structures 60 on a spectrum graph 80, as heretofore described with respect to FIG. 9.

As indicated in step 5 of FIG. 8, the computer 58 retrieves the actual and simulated spectographic information, based on the grating bar 30, from the library database and plots this information as the theoretical optical scatterometry spectrum lines 82 on the spectrum graph 80, as shown in FIG. 9. The computer 58 further plots the spectographic information which was previously obtained by spectographic analysis of the transistor structures 60 on the production wafer 62 using the system 46, and plots this information as the experimental optical scatterometry spectrum line 84 in the spectrum graph 80 of FIG. 9. Therefore, both the theoretical spectrum lines 82 and the experimental spectrum line 84 are plotted together on the same spectrum graph 80, as indicated in step 5 of FIG. 8 and shown in FIG. 9.

With the theoretical optical scatterometry spectrum lines 82 and the experimental optical scatterometry spectrum line 84 superimposed on the same spectrum graph 80, a complete or relative congruency or homology can be observed between the experimental spectrum line 84 and the closest of the theoretical spectrum lines 82. Accordingly, the theoretical spectrum line 82 which most closely matches the experimental spectrum line 84, for each light polarization value (along the Y-axis) at each wavelength (along the X-axis), corresponds to the grating targets 33 having the actual or computer-simulated structural characteristics which most closely correspond to the structural characteristics of the transistor structures 60 on the production wafer 62. In FIG. 9, the theoretical spectrum line 82a is the most congruent with the experimental spectrum line 84. Accordingly, as indicated in step 6 of FIG. 8, the critical dimension (CD), top loss, spacer width, SWA and other structural aspects of the transistor structures 60 on the production wafer 62 are revealed by those respective actual or computer-simulated characteristics of the grating targets 33 which produced the theoretical spectrum line 82 that most closely matches the experimental spectrum line 84. The computer 58 thus matches the theoretical spectrum line 82a with the simulated structural characteristics of the grating targets 33 which generated the theoretical spectrum line 82a. The actual structural characteristics of the transistor structures 60 are therefore equated with the simulated structural characteristics of those grating targets 33. The computer 58 may be programmed to indicate any of the desired structural characteristics, such as the spacer width, top loss, top loss range, uniformity of the transistor structures 60 across the production wafer 62 or uniformity of the spacing 74 between transistor structures 60 across the production wafer 62, as a readout parameter for the structural characteristics or geometry.

In a preferred embodiment, a criteria for a judgment parameter are set for the degree of homology between the experimental spectrum line 84 and the multiple theoretical spectrum lines 82. This judgment parameter for the degree of homology can be expressed by numerals from 0 to 1. For example, a perfect homology between the experimental spectrum line 84 and the most closely-fitting theoretical spectrum line 82 could be expressed by the numeral "1". On the other hand, the numeral "0" would indicate no homology between a theoretical spectrum line 82 and the experimental spectrum line 84.

In one embodiment, the system 46 may be installed in an etching process tool (not shown) used to etch the production wafers 62, in which case the computer 58 of the system 46 interfaces with the control system of the tool. As multiple production wafers 62 are processed in successive lots through the etcher and then subjected to in-line spectroscopy measurement using the spectroscopic ellipsometer system 46, in the manner heretofore described, an SPC chart (not shown) can be constructed for the purpose of monitoring the etching process. The SPC chart includes the output parameters of the experimental spectrum line 84 for each of the production wafers 62 in the lot subjected to spectroscopy after etching, along with the readout parameters of the theoretical spectrum line 82 which corresponds to the ideal structural characteristics, including the spacer width and top loss, for the sidewall spacers 72 of the transistor structures 60 on each of the production wafers 62. Control limits are then set for the SPC chart. In the event that the output parameters of the experimental spectrum line 84 for the etched production wafers 62 in the production lot strays beyond the control limits set for the SPC chart, an audible alarm, visual alarm or both may be activated to alert operating personnel to the out-of-sync condition of the etching process. Alternatively, operation of the etching tool may be automatically terminated in the event that the output parameters of the experimental spectrum line 84 for any of the etched production wafers 62 strays beyond the control limits for the SPC chart.

Figure 10:
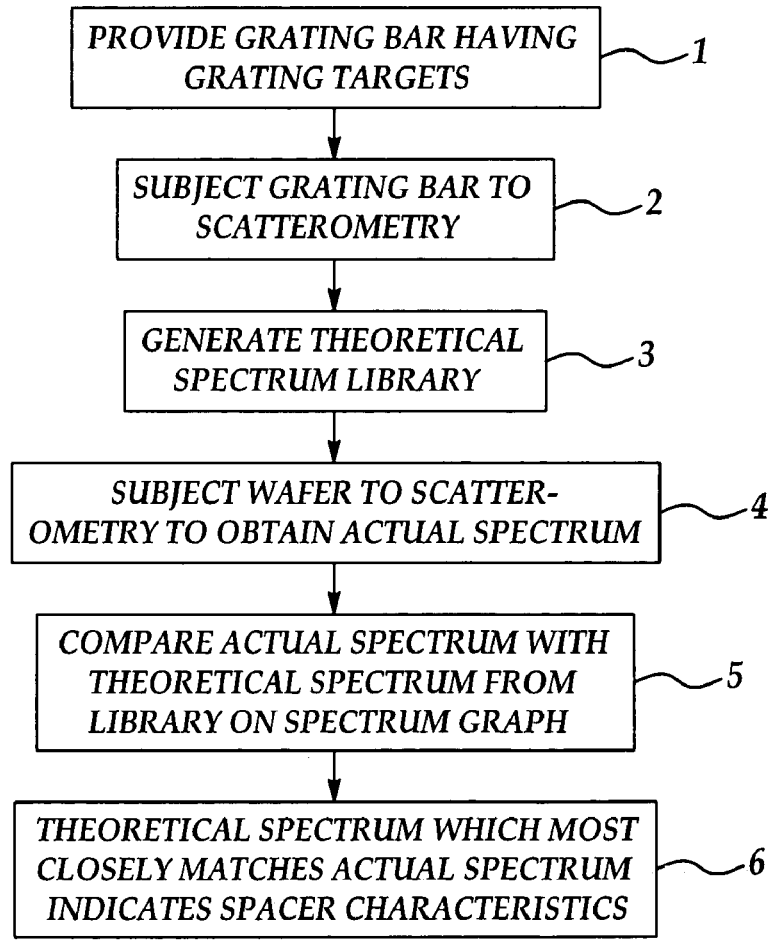
FIG. 10 is a flow diagram which summarizes sequential process steps carried out according to a preferred embodiment of the method of the present invention.

The flow diagram of FIG. 10 summarizes a typical flow of process steps carried out according to the method of the present invention. In step 1, a grating bar having grating targets fabricated thereon is provided. The grating targets approximate the CD, spacing, spacer width, top loss, SWA, film stack, line/space ratio and other structural characteristics of transistor structures fabricated on production wafers. In step 2, the grating bar is subjected to optical scatterometry using a spectroscopic ellipsometer system to obtain a theoretical optical scatterometry spectrum which is determined by the structural characteristics of the grating targets. Computer simulations may be used to vary the structural characteristics of the grating targets and obtain a variety of theoretical optical scatterometry spectra. In step 3, a theoretical spectrum library, which contains the theoretical optical scatterometry spectra, is created.

In step 4, a production wafer is subjected to optical scatterometry using the spectroscopic ellipsometer system to obtain an experimental optical scatterometry spectrum which is determined by the structural characteristics of the transistor structures with sidewall spacers fabricated on the production wafer. In step 5, the experimental spectrum is compared to the theoretical spectra. This is accomplished typically by plotting the experimental spectrum with the theoretical spectra on a spectrum graph on which the degree of polarization of light is plotted as a function of wavelength. In step 6, a match is made between the experimental spectrum and the theoretical spectrum which most closely matches the experimental spectrum. The theoretical spectrum which most closely matches the experimental spectrum corresponds to actual or simulated structural characteristics of the grating targets which are substantially the same as the structural characteristics of the transistor structures.

While the preferred embodiments of the invention have been described above, it will be recognized and understood that various modifications can be made in the invention and the appended claims are intended to cover all such modifications which may fall within the spirit and scope of the invention.

What is claimed is:

1. A method of analyzing structural characteristics of sidewall spacers fabricated on a wafer, comprising the steps of:
    etching said sidewall spacers on said wafer using an etcher;
    providing a grating bar having a plurality of grating targets each comprising a gate electrode and a pair of dielectric spacers;
    generating a theoretical optical scatterometry spectrum by subjecting said grating targets to input light in optical scatterometry;
    generating an experimental optical scatterometry spectrum by subjecting said sidewall spacers to input light in optical scatterometry;
    comparing said experimental optical scatterometry spectrum to said theoretical optical scatterometry spectrum; and
    equating said structural characteristics of said sidewall spacers with said structural characteristics of said grating targets when said theoretical optical scatterometry spectrum substantially matches said experimental optical scatterometry spectrum.

2. The method of claim 1 further comprising the steps of providing an SPC chart having said experimental optical scatterometry spectrum and said theoretical optical scatterometry spectrum, providing control limits for said SPC chart and activating an alarm when said experimental optical scatterometry spectrum strays beyond said control limit.

3. The method of claim 2 wherein said optical scatterometry utilizes two spectra of said input light.

4. The method of claim 1 further comprising the step of cleaning said wafer in a wet-clean process after said etching the sidewall spacers on said wafer.

5. The method of claim 1 wherein said dielectric spacer is a single-layer dielectric spacer or a multi-layer dielectric spacer.

6. The method of claim 1 wherein said dielectric material is a material selected from the group consisting of an oxide, a nitride, an oxynidride, silicon carbide, and any combination of an oxide, a nitride, an oxynitride and silicon carbide.

7. The method of claim 1 further comprising a spectroscopic ellipsometer system for carrying out said optical scatterometry and a computer connected to said system, and wherein said theoretical optical scatterometry spectrum is generated simultaneously with said experimental optical scatterometry spectrum in a real-time mode.

8. The method of claim 1 further comprising the step of indicating a portion of said structural characteristics of said sidewall spacers as a readout parameter and wherein said readout parameter comprises a width of said sidewall spacers.

9. The method of claim 1 further comprising a spectroscopic ellipsometer system for carrying out said optical scatterometry and a computer connected to said system, and wherein said theoretical optical scatterometry spectrum and said structural characteristics of said grating targets are stored as a library in said computer.

10. The method of claim 1 further comprising the step of obtaining theoretical optical scatterometry spectra by generating computer simulations of said structural characteristics of said grating targets.

11. The method of claim 1 further comprising a spectroscopic ellipsometer system for carrying out said optical scatterometry and wherein said spectroscopic ellipsometer system is installed in said etcher.

12. The method of claim 1 wherein said input light comprises wavelength of from about 200 nm to about 900 nm.

13. The method of claim 1 wherein said input light is polarized.

14. The method of claim 1 wherein said plurality of grating targets define a grating area of at least about 20 $\mu m^2$.

15. The method of claim 1 further comprising establishing a judgment parameter for said comparing said experimental optical scatterometry spectrum to said theoretical optical scatterometry spectrum, wherein 0 is no homology and 1 is complete homology.

16. The method of claim 1 grating bar comprises a silicon bar substrate and wherein said grating targets are provided on said grating bar.

17. The method of claim 1 further comprising the step of indicating a portion of said structural characteristics of said sidewall spacers as a readout parameter and wherein said readout parameter comprises a spacing between said sidewall spacers.

18. A method of analyzing structural characteristics of sidewall spacers fabricated on a wafer, comprising the steps of:
    etching said sidewall spacers on said wafer using an etcher;
    providing a grating bar having a plurality of grating targets each comprising a gate electrode and a pair of dielectric spacers each selected from the group consisting of a single-layer offset spacer, an L-shaped spacer, a triangular-shaped spacer and a trapezoid-shaped spacer;
    generating a theoretical optical scatterometry spectrum by subjecting said grating targets to input light in optical scatterometry;
    generating an experimental optical scatterometry spectrum by subjecting said sidewall spacers to input light in optical scatterometry;
    comparing said experimental optical scatterometry spectrum to said theoretical optical scatterometry spectrum; and
    equating said structural characteristics of said sidewall spacers with said structural characteristics of said grating targets when said theoretical optical scatterometry spectrum substantially matches said experimental optical scatterometry spectrum.

19. The method of claim 18 wherein said single-layer offset spacer is up to about 1,000 angstroms.

20. The method of claim 18 wherein said dielectric spacers are absent from a top portion of said gate electrode.

21. The method of claim 20 wherein said readout parameter further comprises a top loss of said sidewall spacers.

22. A method of analyzing structural characteristics of sidewall spacers fabricated on a wafer, comprising the steps of:
    etching said sidewall spacers on said wafer using an etcher;
    providing a grating bar having a plurality of grating targets each comprising a gate electrode and a pair of dielectric spacers flanging said gate electrode and absent from a top portion of said gate electrode;
    generating a theoretical optical scatterometry spectrum by subjecting said grating targets to input light in optical scatterometry;
    generating an experimental optical scatterometry spectrum by subjecting said sidewall spacers to input light in optical scatterometry;
    comparing said experimental optical scatterometry spectrum to said theoretical optical scatterometry spectrum;
    equating said structural characteristics of said sidewall spacers with said structural characteristics of said grating targets when said theoretical optical scatterometry spectrum substantially matches said experimental optical scatterometry spectrum; and
    indicating a portion of said structural characteristics of said sidewall spacers as a readout parameter and wherein said readout parameter comprises a spacer top loss range of said sidewall spacers across said wafer.

* * * * *